United States Patent [19]
Narimatsu

[11] Patent Number: 6,114,072
[45] Date of Patent: Sep. 5, 2000

[54] RETICLE HAVING INTERLOCKING DICING REGIONS CONTAINING MONITOR MARKS AND EXPOSURE METHOD AND APPARATUS UTILIZING SAME

[75] Inventor: Koichiro Narimatsu, Hyogo, Japan

[73] Assignee: Mitsubishi Denki Kabushiki Kaisha, Tokyo, Japan

[21] Appl. No.: 09/100,091

[22] Filed: Jun. 19, 1998

[30] Foreign Application Priority Data

Jan. 14, 1998 [JP] Japan .................................. 10-006014

[51] Int. Cl.⁷ ...................................................... G03F 9/00
[52] U.S. Cl. .............................. 430/5; 355/53; 430/311; 438/462
[58] Field of Search ................................ 438/462; 430/5, 430/311; 355/53

[56] References Cited

U.S. PATENT DOCUMENTS

| | | | |
|---|---|---|---|
| 5,496,777 | 3/1996 | Moriyama | 437/249 |
| 5,795,815 | 8/1998 | Vokoun et al. | 438/462 |
| 5,868,560 | 2/1999 | Tamada et al. | 430/5 |

FOREIGN PATENT DOCUMENTS

| | | |
|---|---|---|
| 2-174110 | 7/1990 | Japan . |
| 5-109605 | 4/1993 | Japan . |
| 9-127680 | 5/1997 | Japan . |

*Primary Examiner*—Christopher G. Young
*Assistant Examiner*—Saleha R. Mohamedulla
*Attorney, Agent, or Firm*—McDermott, Will & Emery

[57] ABSTRACT

On one of opposing sides of a rectangular prescribed region consisting of element forming regions and a dicing region placed therebetween, a dicing region is formed to have recessed and extended portions which fit recessed and extended portions of another dicing region which is arranged on the other one of the opposing sides. At extended portions of the dicing region, monitor mark regions are arranged corresponding to all four corners of the prescribed region. Therefore, a reticle which can prevent degradation in registration accuracy caused by shot rotation error or shot magnification error without increasing area of the dicing region is provided, and further, method and apparatus for exposure using the reticle are provided.

9 Claims, 18 Drawing Sheets

RETICLE

WAFER

RETICLE HAVING INTERLOCKING DICING REGIONS CONTAINING MONITOR MARKS AND EXPOSURE METHOD AND APPARATUS UTILIZING SAME

BACKGROUND OF THE INVENTION

1. Field of the Invention

The present invention relates to a reticle used for step and repeat exposure, to method and apparatus of exposure using the reticle, and to semiconductor device.

2. Description of the Background Art

Reduction type projection printing has been known as an apparatus of projection exposure for transferring a pattern drawn on a reticle to a resist. In reduction type projection printing, step and repeat method is used, and a mechanism for realizing this method is provided.

The step and repeat method refers to a method of transferring a reticle pattern to a resist in which exposure is performed every time a wafer on a two-dimensionally movable X-Y stage is fed by a given distance. The method of exposure by the reduction type projection printing will be described in the following.

FIG. 14 shows a manner of exposure by a conventional reduction type projection printing apparatus. Referring to FIG. 14, a beam (g-line or i-line) from a mercury lamp is directed from a light source 51 through a condenser lens 50 to a glass mask (reticle) 210. The beam passed through reticle 21 is projected on a photoresist on a wafer 20 through a reduction projection lens 40.

In such a reduction type projection printing apparatus, an area which can be exposed at one time (one shot) is about 20 mm×20 mm, for example. Position of wafer 20 is automatically moved successively in X, Y direction by an X-Y stage 52, and wafer 20 is exposed shot by shot.

Wafer 20 is vacuum fixed on X-Y stage 52.

Structure of a conventional reticle used for reduction type projection printing will be described.

FIG. 15 is a schematic plan view showing the structure of the conventional reticle. FIGS. 16 and 17 are partial plan views showing, in enlargement, areas P5 and P6 of FIG. 15.

Referring to FIG. 15, a structure of a reticle 210 having two circuit patterns corresponding to two chips formed in one shot is shown. More specifically, element forming regions 1A and 1B each correspond to a circuit pattern of one chip. A dicing region 3B is arranged between element forming regions 1A and 1B. Element forming regions 1A and 1B as well as dicing region 3B constitute a prescribed region 2 having a rectangular planar shape.

Referring to FIGS. 15 and 16, a relatively wide dicing region 203A is arranged outside and to be in contact with left and lower sides in the figure of the prescribed region 2. In the wide dicing region 203A, monitor mark regions, that is, alignment mark regions 5 and registration accuracy measurement marks 7 are arranged at an upper left corner, a lower left corner and a lower right corner in the figure of prescribed region 2. Further, monitor mark regions 5 and 7 are also arranged in dicing region 3B.

Referring to FIGS. 15 and 17, a relatively thin dicing region 203C is arranged on right and upper sides in the figure, outside prescribed region 2.

Referring to FIGS. 15 to 17, an overlap region (slit region) 204 is arranged in contact with each of the relatively wide dicing region 203A and narrow dicing region 203C and surrounding outer peripheries of the dicing regions. Overlap region 204 is provided in consideration of step offset experienced during step and repeat exposure. A light intercepting region 9 is arranged on an outer peripheral region of dicing regions 203A, 203C and overlap region 204.

A cross section of the conventional reticle taken along the line A3—A3 of FIG. 16, for example, is as shown in FIG. 18A. Referring to FIG. 18A, reticle 210 includes a transparent substrate 11, and light intercepting films 13 and 15 formed on transparent substrate 11. Though not shown in the figure, a prescribed circuit pattern is formed by a light intercepting film, in element forming regions 1A and 1B. In alignment mark region 5, a plurality of alignment mark patterns 13 formed of the light intercepting film are arranged. A light intercepting film 15 is formed entirely over the outermost light intercepting region 9.

Process steps up to patterning of a film to be etched of the wafer using the conventional reticle will be described in the following.

The exposure beam which is transmitted through reticle 210 shown in FIG. 15 is directed to the photoresist applied on the wafer, and exposure of one shot is completed. Thereafter, stage 52 on which wafer 20 is mounted moves as shown in FIG. 14, and the next shot is exposed. This time, exposure is performed such that overlap region 204 (FIGS. 16, 17) of the already exposed shot is overlapped with the overlap region 204 of the shot which is to be newly exposed. This is to prevent any region from being left unexposed between adjacent shots because of step offset which occurs during step and repeat exposure.

In this manner, a plurality of shots 260 are exposed on the photoresist as shown in FIG. 19. This shot 260 includes, corresponding to reticle 210 shown in FIG. 15, element forming regions 61A and 61B, relatively wide dicing regions 263A and 263B, a relatively narrow dicing region 263c (not shown), an alignment mark region 65 and a registration accuracy measurement mark region 67. FIG. 19 shows a state in which four shots are exposed. After exposure of each shot 260 onto a photoresist is completed as shown in FIG. 19, the photoresist is developed and the resist pattern is formed.

FIG. 18B corresponds to a cross section taken along the line B3—B3 of FIG. 19 of a wafer corresponding to the reticle of FIG. 18A. Referring to FIG. 18B, when the photoresist 27 is of positive type, only non-exposed regions of photoresist 27 are left by development. Using resist pattern 27 as a mask, underlying film 23 to be etched is etched, and film 23 is patterned to a desired shape. Thereafter, resist pattern 27 is removed. Here, an example is shown in which a protruding alignment mark 23 is formed on a semiconductor substrate 21 in alignment mark region 65.

In FIG. 18B, photoresist 27 is not left at a region corresponding to light intercepting region 9 on the wafer, as part of the element forming region 61B and the dicing region of neighboring shot are positioned on this region.

Generally, in order to superpose the reticle pattern and the wafer pattern with high accuracy, reticle position is aligned with the wafer position. This alignment is more specifically performed by recognizing position of the alignment mark on the wafer by using diffracted beam, for example, determining shot rotation, reduction ratio and the like based on the recognition, and registering the position of the wafer alignment mark with the position of the reticle alignment mark.

In the conventional reticle, however, it is not possible to place alignment mark 5 near an upper right corner of the prescribed region 2 in FIG. 15. Therefore, position offset information at this corner is missed. Accordingly, positional offset (that is, error in shot magnification, error in shot rotation or the like) tends to occur at the upper right corner of the short transferred to the photoresist.

After exposure-development, generally, registration error between the wafer circuit pattern and a resist pattern is measured. Measurement of registration error is performed by a known method such as box-in-box method. More specifically, whether the patterns are superposed with high accuracy or not is determined referring to relative positions of registration mark formed by the same layer as the circuit pattern on the wafer and the registration mark formed on the resist pattern. When the registration error is within a tolerable range, the resist pattern is used as a mask and a film is etched. When the registration error exceeds the tolerable range, application, exposure and development of the photoresist are performed again.

In the conventional reticle, however, it is not possible to place registration mark 7 near the upper right corner of FIG. 15. Therefore, similar to the case of an alignment mark, position offset information of this corner is missed, resulting in a problem of degraded registration accuracy because of an error in shot magnification, an error in shot rotation or the like.

Even when analysis is performed using the result of registration inspection and exposure is performed with alignment corrected, it is not possible to calculate a value for correction of the alignment at the upper right portion of the shot, which leads to degraded registration accuracy.

In order to prevent degradation of registration accuracy, the reticle structure may be modified as shown in FIG. 20.

Referring to FIG. 20, in this structure, relatively wide dicing regions 303A are arranged on all four sides outside a prescribed rectangular region 302. Prescribed region 302 includes element forming regions 1A and 1B and a dicing region 303B positioned therebetween, similar to the example described above.

As relatively wide dicing regions 303A are arranged on all of the four sides, it becomes possible to arrange monitor mark regions such as alignment mark region 5 and registration accuracy measurement mark region 7 near all four corners of prescribed region 302. Therefore, degradation of registration accuracy resulting from missing monitor mark 5 or 7 at any corner of the prescribed region 302 is prevented.

In this case, however, the width $W_0$ of dicing region 363A between the shots becomes wider and comes to occupy large area as shown in FIG. 21. Therefore, planer occupation of element forming regions 61A and 61B on the wafer is reduced, and yield of the semiconductor chip per wafer is reduced.

SUMMARY OF THE INVENTION

An object of the present invention is to provide a reticle which prevents degradation of registration accuracy derived from error in shot rotation or shot magnification, without increasing area of a dicing region, to provide a method and apparatus for exposure using the reticle and to provide a semiconductor device.

The reticle in accordance with the present invention includes first and second outer peripheral dicing regions, and a monitor mark region. A prescribed region, which has a rectangular planar shape, consists of a single element forming region, or a plurality of element forming regions and an intermediate dicing region placed between the element forming regions. The first outer peripheral dicing region is in contact with one side of opposing sides of the prescribed region of the rectangular planar shape, and the dicing region has planar shape with wide, extended portion and a narrow, recessed portion. The second outer peripheral dicing region is arranged on the other side of the opposing sides, and has a planar shape with a wide portion and a narrow portion which wide and narrow portions conforming to be fitted in the narrow and wide portions of the first outer peripheral dicing region. Monitor mark regions are arranged in the wide portions of the first and second outer peripheral dicing regions corresponding to all the four corners of the rectangular planar shape of the prescribed region.

According to the reticle of the present invention, the first and second outer peripheral dicing regions arranged on opposing sides have wide and narrow portions. Therefore, it is possible to provide wide portions near all the four corners of a prescribed rectangular region and to arrange monitor mark regions at the wide portions. Therefore, position offset information is not missed at any one corner, and therefore degradation in registration accuracy derived from shot rotation error or shot magnification error can be avoided.

The first and second outer peripheral dicing regions have such shapes that include wide and narrow portions which are fit with each other. Therefore, when shots are transferred continuously, in a narrow portion of the first outer peripheral dicing region of one shot, a wide portion of the second outer peripheral dicing region of another shot is fit, and in a narrow portion of the second outer peripheral dicing region of one shot, a wide portion of the first outer peripheral dicing region of another shot is fit. Therefore, as compared with the prior art example in which the first and second outer peripheral dicing regions are uniformly made wide to allow arrangement of alignment marks and the like, sum of widths of the first and second outer peripheral dicing regions can be reduced.

The reticle described above further includes a transparent substrate and a light intercepting film formed on a surface of the transparent substrate. A light intercepting film is formed on an outer periphery of the first and second outer peripheral dicing regions arranged at an outer periphery of the prescribed region.

Since the light intercepting film is provided at the outer periphery of the reticle, double exposure near the boundary between adjacent shots is avoided.

In the above described reticle, preferably, at least one of the first and second outer peripheral dicing regions has two or more wide or narrow portions.

Therefore, it is possible to appropriately set the number of wide portions of the first and second outer peripheral dicing regions.

In the above described reticle, preferably, the two or more wide portions include wide portions of mutually different widths.

This increases degree of freedom in shape and arrangement of the wide portions.

In the above described reticle, preferably, the first outer peripheral dicing region has a first portion having a first length extending from a first point on one side toward one end of this one side and a second portion having a second length extending from the first point toward the other end of this one side. The second outer peripheral dicing region has a first portion having the second length extending from a second point on the other side toward the one end of the other side and a second portion having the first length extending from the second point to the other end of the other side. The wide and narrow portions of the first portion of the first outer peripheral dicing region has such a shape that fits the narrow and wide portions of the second portion of the second peripheral dicing region, and the wide and narrow portions of the second portion of the first outer peripheral dicing region has such a shape that fits the narrow and wide portions of the first portion of the second outer peripheral dicing region.

Accordingly, even when one shot and another shot which is adjacent to the one shot are arranged offset by ½ shot, for example, the wide and narrow portions of the first and second outer peripheral dicing regions fit with each other. Therefore, the first outer peripheral dicing region of one shot and the second outer peripheral dicing region of another shot can be reduced.

The exposure apparatus using the reticle in accordance with the present invention includes a light source for emitting exposure light beam, a reticle irradiated with the exposure light beam from the light source and a stage, for directing the exposure beam transmitted through the reticle to the side of the stage, with the reticle used in the apparatus having the following structure. The reticle has a prescribed region, first and second outer peripheral dicing regions and monitor mark regions. The prescribed region has a rectangular planar shape and consists of a single element forming region, or a plurality of element forming regions and an intermediate dicing region placed between the element forming regions. The first outer peripheral dicing region is in contact with one side of opposing sides of the rectangular planar shape of the prescribed region, and has a planar shape with wide, extended portion and a narrow, recessed portion. The second outer peripheral dicing region is arranged in contact with the other side of the opposing sides, and has a planar shape having narrow and wide portions which are fit in the wide and narrow portions of the first outer peripheral dicing region. The monitor mark regions are arranged in wide portions of the first and second outer peripheral dicing regions corresponding to all the four corners of the rectangular planar shape of the prescribed region.

According to the exposure apparatus using the reticle for manufacturing semiconductor device in accordance with the present invention, the first and second outer peripheral dicing regions arranged at opposing sides have wide and narrow portions. Therefore, it is possible to provide wide portions near all the four corners of a prescribed rectangular region and to arrange monitor mark regions at the wide portions. Therefore, position offset information is not missed at any corner, and hence degradation in registration accuracy derived from shot rotation error or shot magnification error can be avoided.

The first and second outer peripheral dicing regions have such shapes that have narrow and wide portions fitting with each other. Therefore, when shots are transferred continuously, in a narrow portion of the first outer peripheral dicing region of one of the adjacent shots, a wide portion of the second outer peripheral dicing region of the other shot is fit, while in a narrow portion of the second outer peripheral dicing region of the other shot, a wide portion of the first outer peripheral dicing region of one shot is fit. Therefore, as compared with the prior art example in which the first and second outer peripheral dicing regions are uniformly made wide to allow arrangement of the alignment mark, sum of the widths of the first and second outer peripheral dicing regions can be reduced.

The present invention also provides a method of exposure in which a reticle pattern is transferred side by side continuously as shots on a wafer surface through a reduction type projection lens, which method includes the following steps.

First, exposure light beam is emitted from a light source. The reticle is irradiated with the exposure light beam. The exposure light beam which has passed through the reticle is projected on a photoresist on a semiconductor substrate. The reticle has a prescribed region, first and second outer peripheral dicing regions and monitor mark regions. A prescribed region has a rectangular planar shape and consists of a single element forming region or a plurality of element forming regions and an intermediate dicing region placed between the element forming regions. The first outer peripheral dicing region is in contact with the one side of opposing sides of the rectangular planar shape of the prescribed region, and has a planar shape with a wide, extended portion and a narrow, recessed portion. The second outer peripheral dicing region is arranged in contact with the other side of the opposing sides, and has a planar shape with narrow and wide portions to be fitted with the wide and narrow portions of the first outer peripheral dicing region. Monitor mark regions are arranged in wide portions of the first and second outer peripheral dicing regions corresponding to all four corners of the rectangular planar shape of the prescribed region. Shots are exposed such that of adjacent one and the other shots, a wide portion of the first outer peripheral dicing region of one shot fits in a narrow portion of the second outer peripheral dicing region of the other shot, while a wide portion of the second outer peripheral dicing region of the other shot fits in a narrow portion of the first outer peripheral dicing region of one shot.

According to the method of exposure of the present invention, the first and second outer peripheral dicing regions arranged on opposing sides have wide portions and narrow portions, and therefore it is possible to form wide portions near all four corners of the prescribed rectangular region and to arrange monitor mark regions in the wide portions. Therefore, position offset information is not missed at any corner, and hence degradation in registration accuracy derived from shot rotation error or shot magnification error can be avoided.

The first and second outer peripheral dicing regions have such shapes that have narrow portions and wide portions to be fitted to each other. Therefore, when shots are transferred continuously, of adjacent shots, in a narrow portion of the first outer peripheral dicing region of one shot, a wide portion of the second outer peripheral dicing region of the other shot fits, while in a narrow portion of the second outer peripheral dicing region of the other shot, a wide portion of the first outer peripheral dicing region of one shot fits. Therefore, as compared with the prior art example in which the first and second outer peripheral dicing regions are uniformly made wide to allow arrangement of alignment marks, for example, the sum of widths of the first and second outer peripheral dicing regions can be reduced.

In the above described exposure method, preferably, the reticle further includes an overlap region arranged on the entire outer periphery of and in contact with the first and second outer peripheral dicing regions. An overlap region in contact with the first outer peripheral dicing region of one shot is exposed to be overlapped with an overlap region in contact with the second outer peripheral dicing region of another shot.

Accordingly, even when there is a step offset in exposing shots, no region is left unexposed between the shots.

The semiconductor device of the present invention has a pattern transferred by using the above described reticle in accordance with the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

Figure 1:
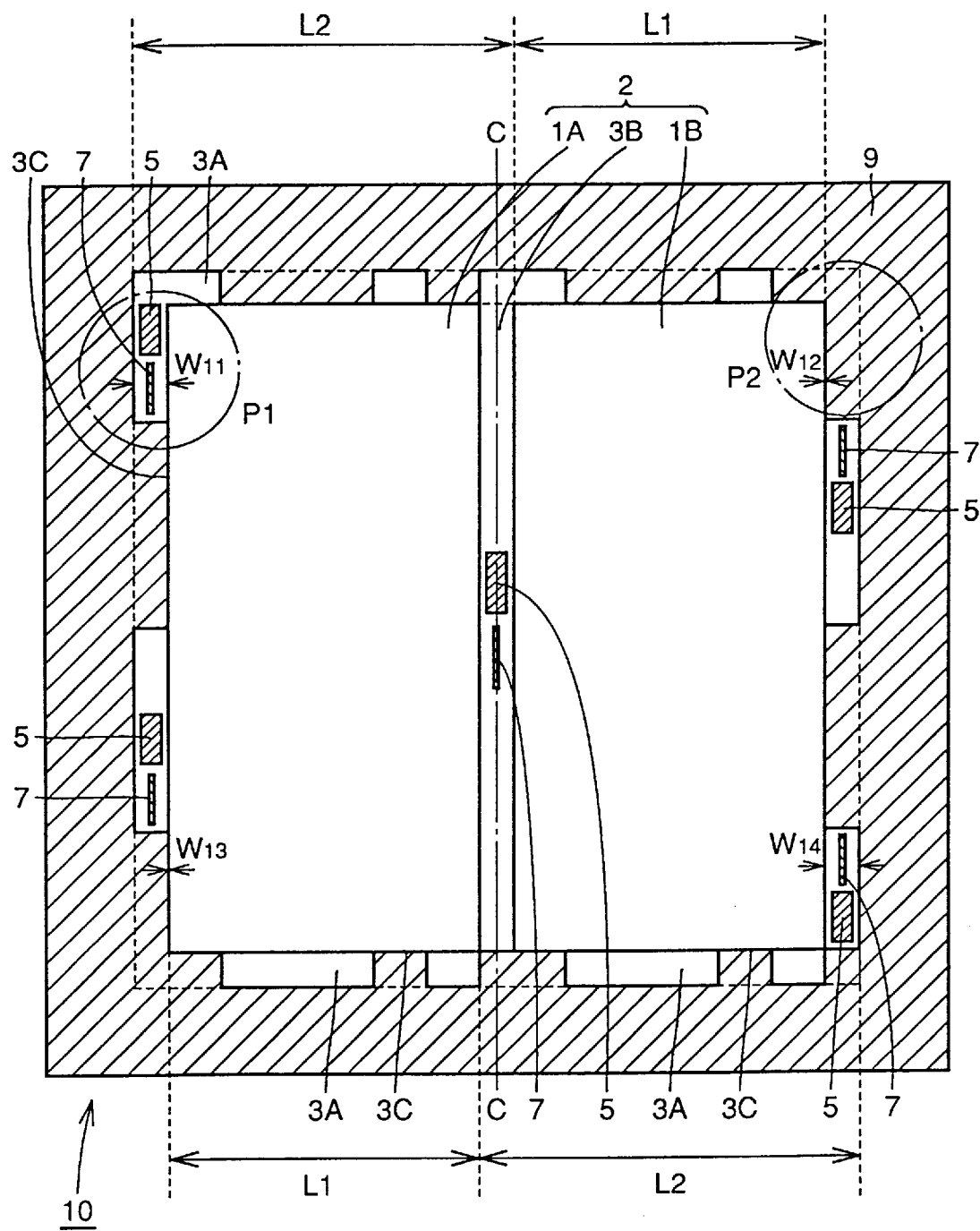
FIG. 1 is a plan view schematically showing a structure of a reticle in accordance with a first embodiment of the present invention.

FIG. 1 shows a structure in which circuit pattern corresponding to two chips is formed in one shot. In other words, each of element forming regions 1A and 1B corresponds to a circuit pattern of one chip. Element forming regions 1A and 1B and a dicing region 3B placed therebetween constitute a prescribed region 2 having rectangular planar shape. Dicing regions 3A and 3C are arranged at outer peripheral regions to be in contact with each side of the prescribed region 2.

Figure 2:
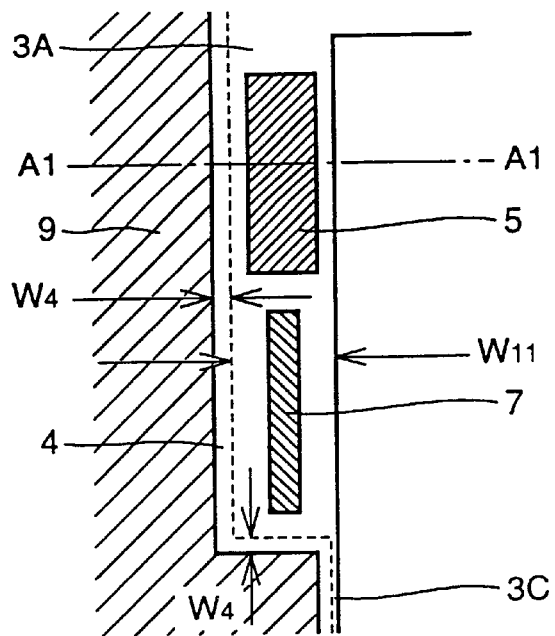
FIG. 2 is a partial plan view showing in enlargement, a region P1 of FIG. 1.
Figure 3:
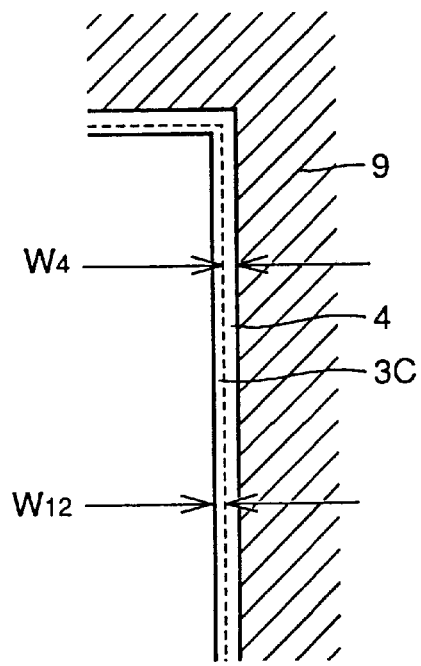
FIG. 3 is a partial plan view showing in enlargement, a region P2 of FIG. 1.

Referring to FIGS. 1 to 3, dicing regions 3A and 3C have widths ($W_{11}$~$W_{14}$) varying along the direction of the side. Namely, it has a wide, extended portion 3A (portions having widths $W_{11}$ and $W_{14}$, for example), and recessed portions 3C with narrower width (for example, portions having the widths $W_{12}$ and $W_{13}$).

Dicing regions 3A and 3C specifically has planar shapes with extensions and recesses as will be described in the following.

Namely, a wide portion 3A of a left dicing region arranged on one of opposing outer sides of prescribed region 2 (for example, left side in the figure) fits in a narrow portion 3C of a right dicing region arranged on the other one of the opposing sides (for example, right side in the figure), and a wide portion 3A of the right dicing region fits in a narrow portion 3C of the left dicing region.

More specifically, the sum of the width of the left dicing region and the width of the right dicing region positioned in symmetry with respect to a phantom line C—C passing through the center of prescribed region 2 ($W_{11}+W_{12}$, $W_{13}+W_{14}$) is constant in the upward/downward direction in the figure. In other words, the relation $W_{11}+W_{12}=W_{13}+W_{14}$ holds. This relation also applies to the upper and lower dicing regions arranged to be in contact with the upper and lower sides in the figure of prescribed region 2.

In the wide portions, monitor mark regions such as alignment mark region 5 and registration accuracy measurement mark region 7 are arranged, corresponding to all four corners of the prescribed region 2.

It is preferred that an overlap region 4 is arranged to be in contact with and surrounding outer periphery of dicing region 3A. Overlap region 4 is provided taking into account a step offset experienced in step and repeat exposure. At an outer peripheral region of dicing region 3A and overlap region 4, a light intercepting region 9 is arranged.

Overlap region 4 may not be provided if the step offset experienced at the time of exposure is within a tolerable range. Though a structure having a overlap region is shown in FIGS. 2 to 4, there may be a structure without overlap region 4.

The shape of recesses and extensions, that is, narrow and wide sections at a portion having the length L1 positioned on the right in the figure of outer peripheral dicing regions 3A and 3C on the upper portion is preferably fits the shape of the recesses and extensions of the portion having the length L1 on the left side in the figure of the dicing regions on the lower portion in FIG. 1. Further, the shape of the recesses and extensions of the region having the length L2 on the left side of the dicing regions at the upper portion preferably fits the shape of the recesses and extensions of the region having the length L2 on the right side in the figure of the dicing regions at the lower portion. Such shape allows satisfactory exposure even when shots are offset by ½.

Figure 4A:
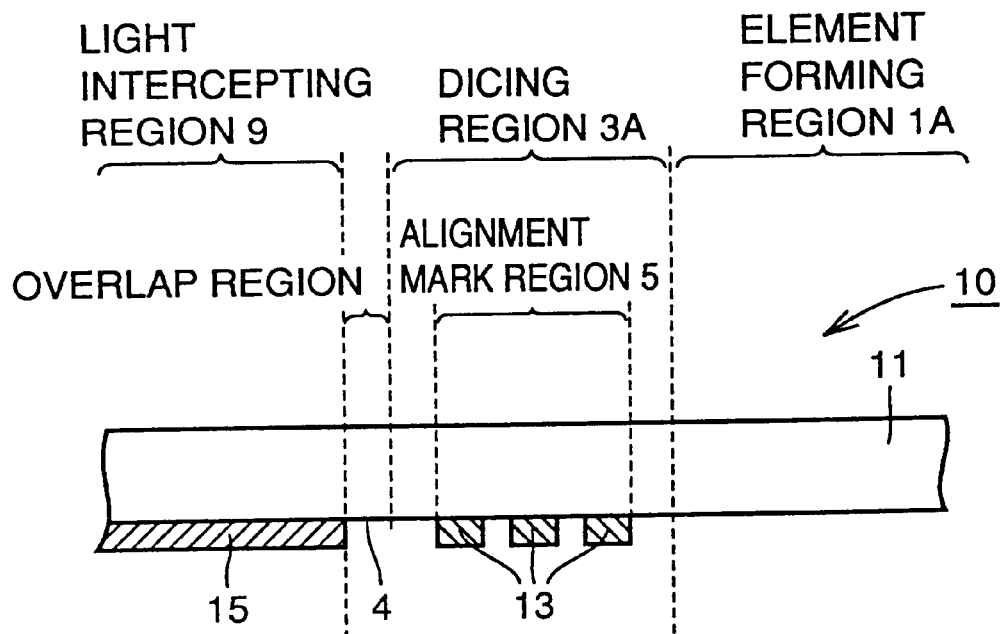
FIG. 4A is a partial cross section of the reticle shown in FIG. 1.

The reticle in accordance with the present embodiment has such a cross section as shown in FIG. 4A, for example, when taken along the line A1—A1 of FIG. 2. Referring to FIG. 4A, reticle 10 has a transparent substrate 11 of quarts, for example, and light intercepting films 13 and 15 of chromium, for example. Though not shown, a prescribed circuit pattern is formed by a light intercepting film, in element forming regions 1A and 1B. In alignment mark region 5, there are a plurality of alignment mark patterns 13 formed of a light intercepting film. A light intercepting film 15 is formed entirely over light intercepting region 9 at the outer periphery of dicing region 3A and overlap region 4.

A structure of an exposing apparatus employing such a reticle will be described in the following.

Figure 5:
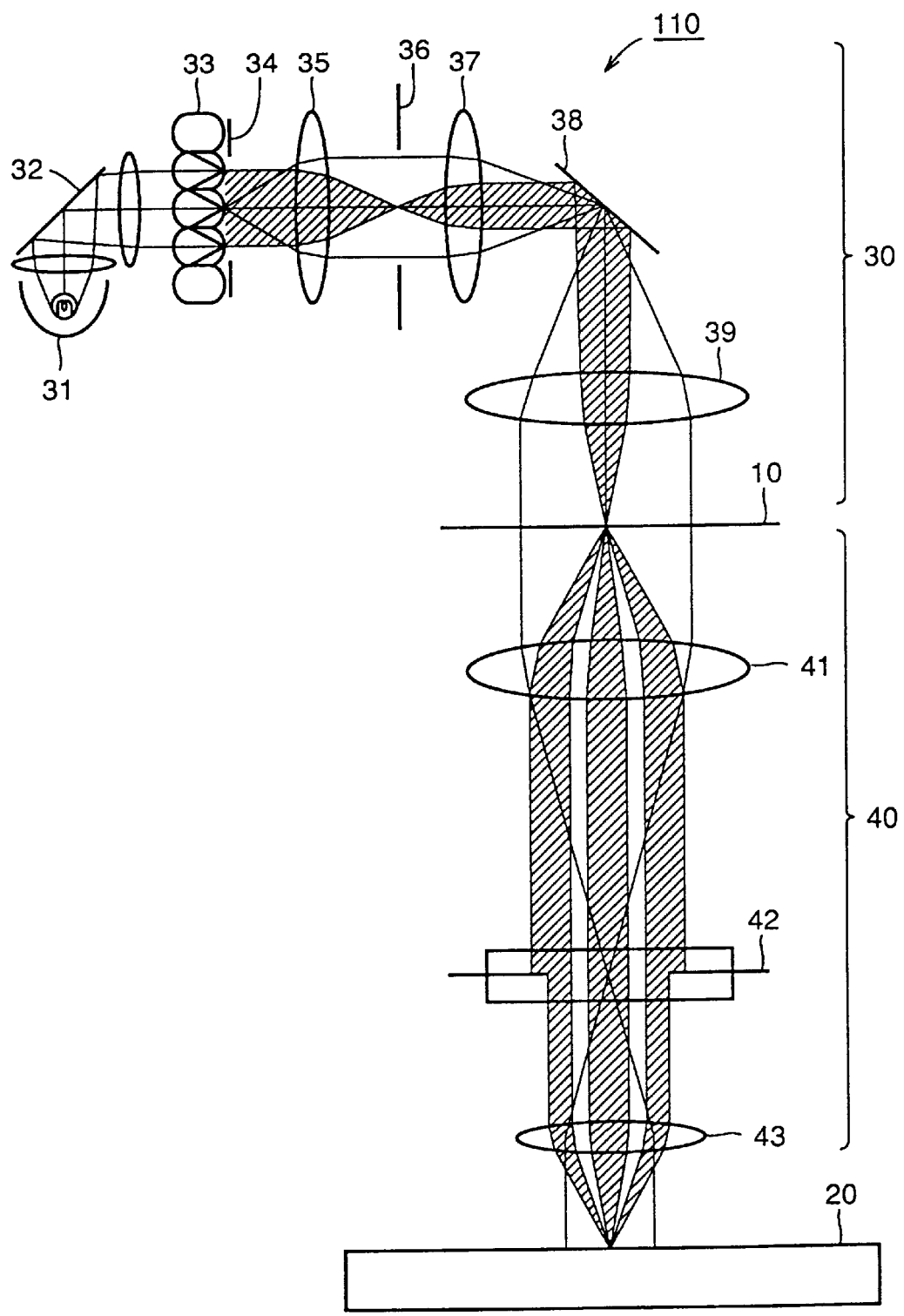
FIG. 5 schematically shows an exposure apparatus employing the reticle in accordance with the first embodiment.

Referring to FIG. 5, the exposure apparatus is for reducing a pattern on the reticle and projecting the pattern onto a photoresist applied on a wafer. The exposure apparatus has a reticle 10, an illumination optical system 30 from a light source to the pattern of reticle 10, and a projection optical system 40 from the pattern of reticle 10 to wafer 20.

Illumination optical system 30 has a mercury lamp 31 as a light source, a reflection mirror 32, a fly eye lens 33, a diaphragm 34, condenser lenses 35, 37 and 39, a blind diaphragm 36, and a reflection mirror 38. Projection optical system 40 has projection lenses 41 and 43, and a mirror diaphragm 42.

In the exposure operation, of the light beams emitted from mercury lap 31, only a g-line (wave length: 436 nm), for example, is reflected by reflection mirror 32, so that a light beam of a single wavelength is obtained. The light beam enters each of the lenses constituting fly eye lens 33, and thereafter passes through diaphragm 34.

The beam which has passed through diaphragm 34 is transmitted through condenser lens 35, blind diaphragm 36 and condenser lens 37, and reflected at a prescribed angle by reflection mirror 38. The light beam reflected by reflection mirror 38 passes through condenser lens 39, and irradiates uniformly the entire surface of reticle 10 (FIG. 1) having a prescribed pattern formed thereon. Thereafter, the beam is reduced to a prescribed magnification by projection lenses 41 and 43, and exposes the photoresist of wafer 20.

The exposure apparatus may be used with i-line (wave length: 365 nm), or excimer laser beam (krF excimer laser beam (wave length: 284 nm), ArF excimer laser beam (wave length: 193 nm)), other than the g-line.

Process steps up to patterning of the film to be etched on the wafer using the reticle in accordance with the embodiment of the present invention will be described in the following.

Figure 14:
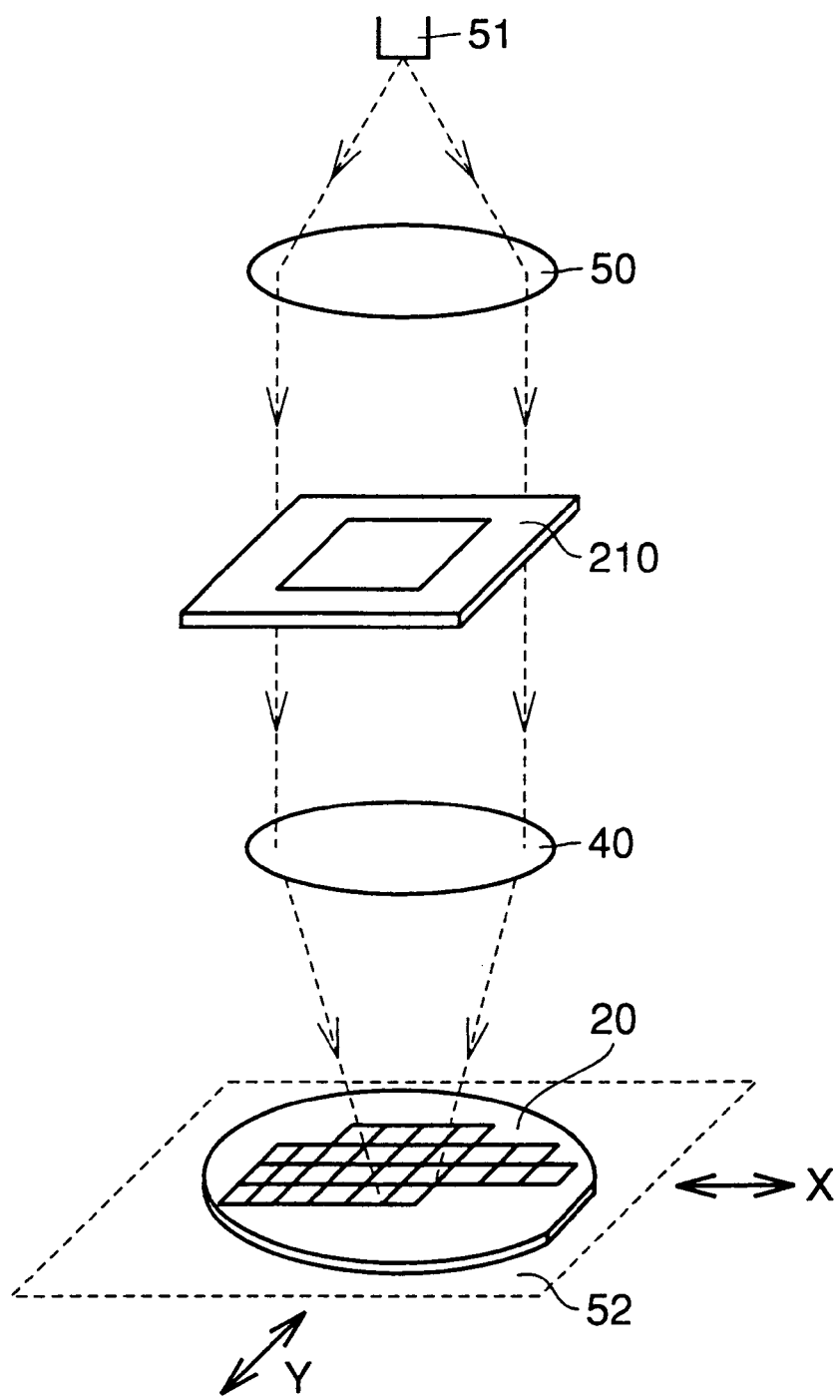
FIG. 14 shows a principle of exposure in a reduction type projection printing in accordance with step and repeat.
Figure 15:
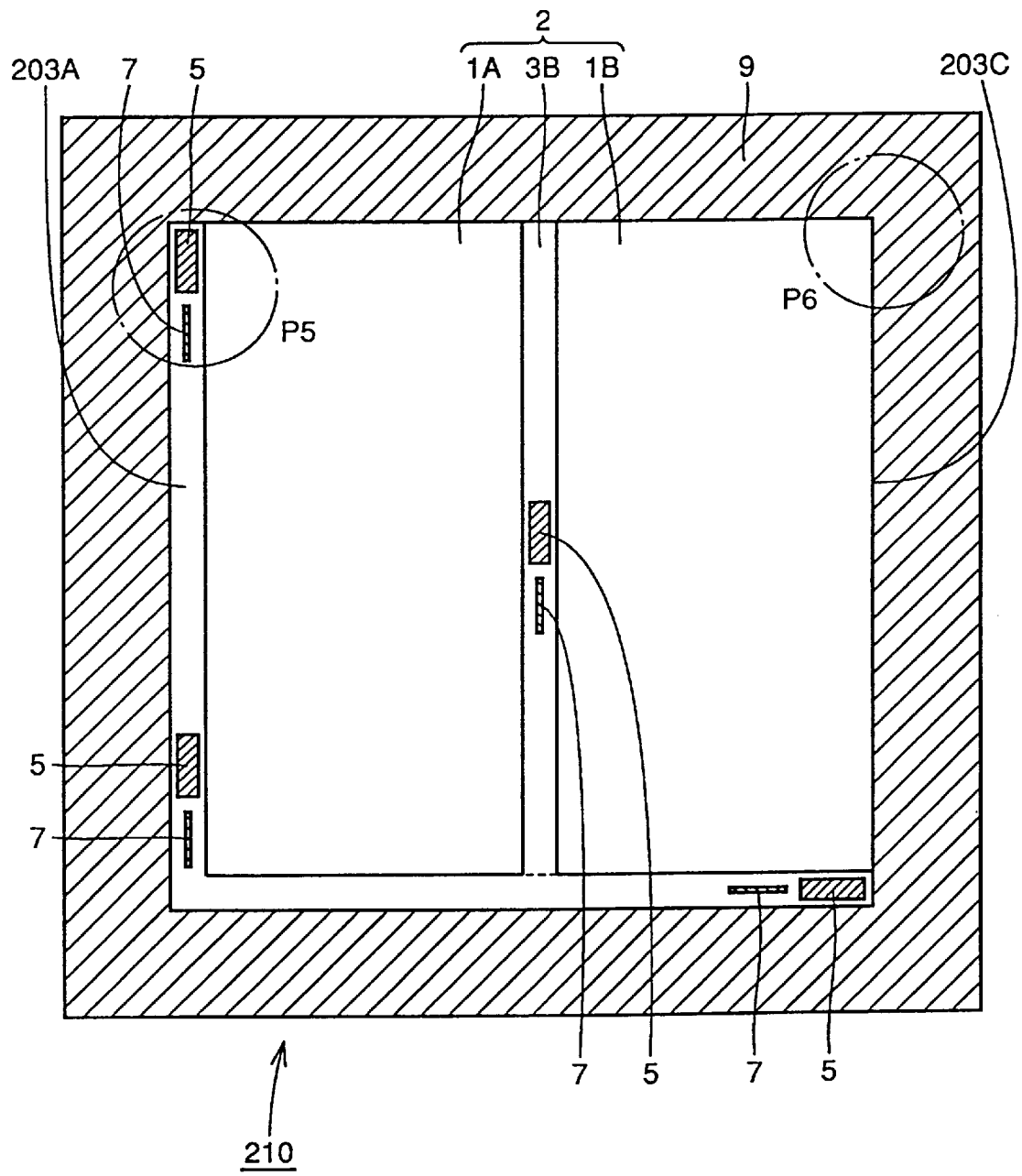
FIG. 15 is a schematic plan view showing a first example of a conventional reticle.
Figure 16:
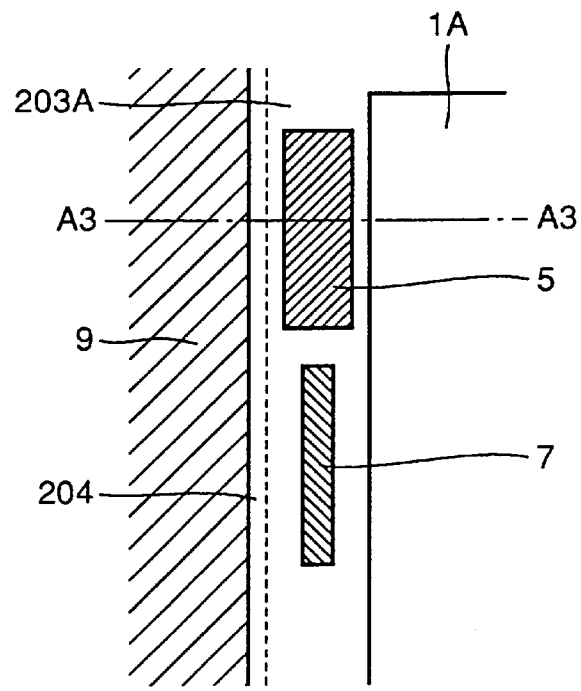
FIG. 16 is a partial plan view showing, in enlargement, a region P5 of FIG. 15.
Figure 17:
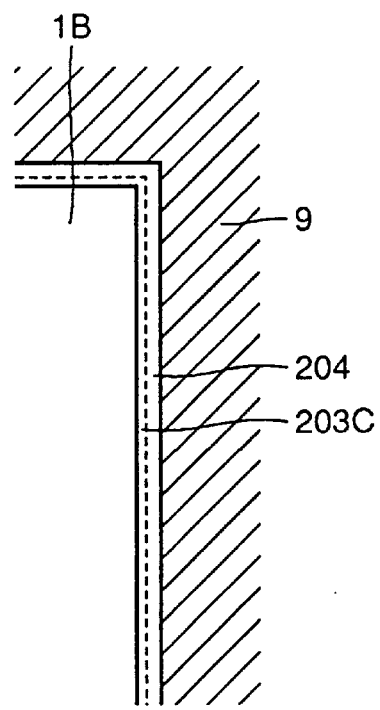
FIG. 17 is a partial plan view showing, in enlargement, a region P6 of FIG. 15.
Figure 18A:
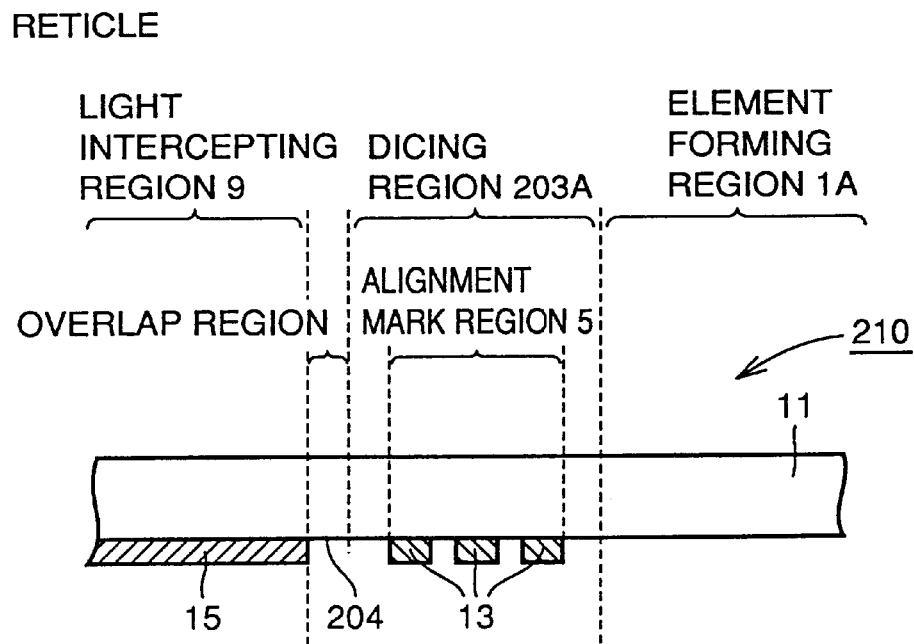
FIG. 18A shows a partial cross section of the reticle shown in FIG. 15.
Figure 18B:
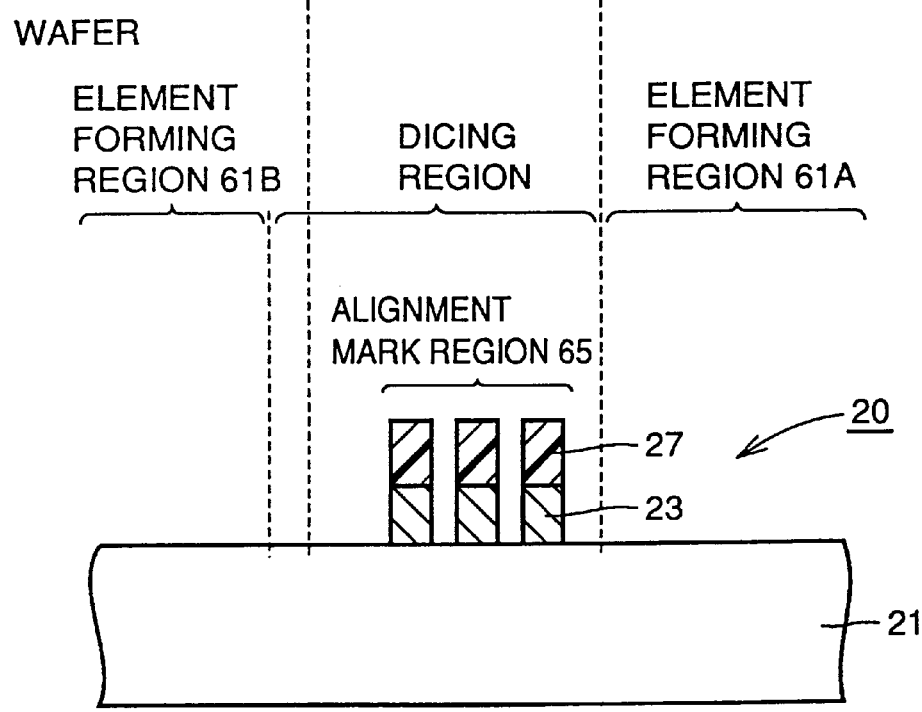
FIG. 18B is a cross section of a wafer to which the pattern of the reticle of FIG. 18A is transferred.
Figure 19:
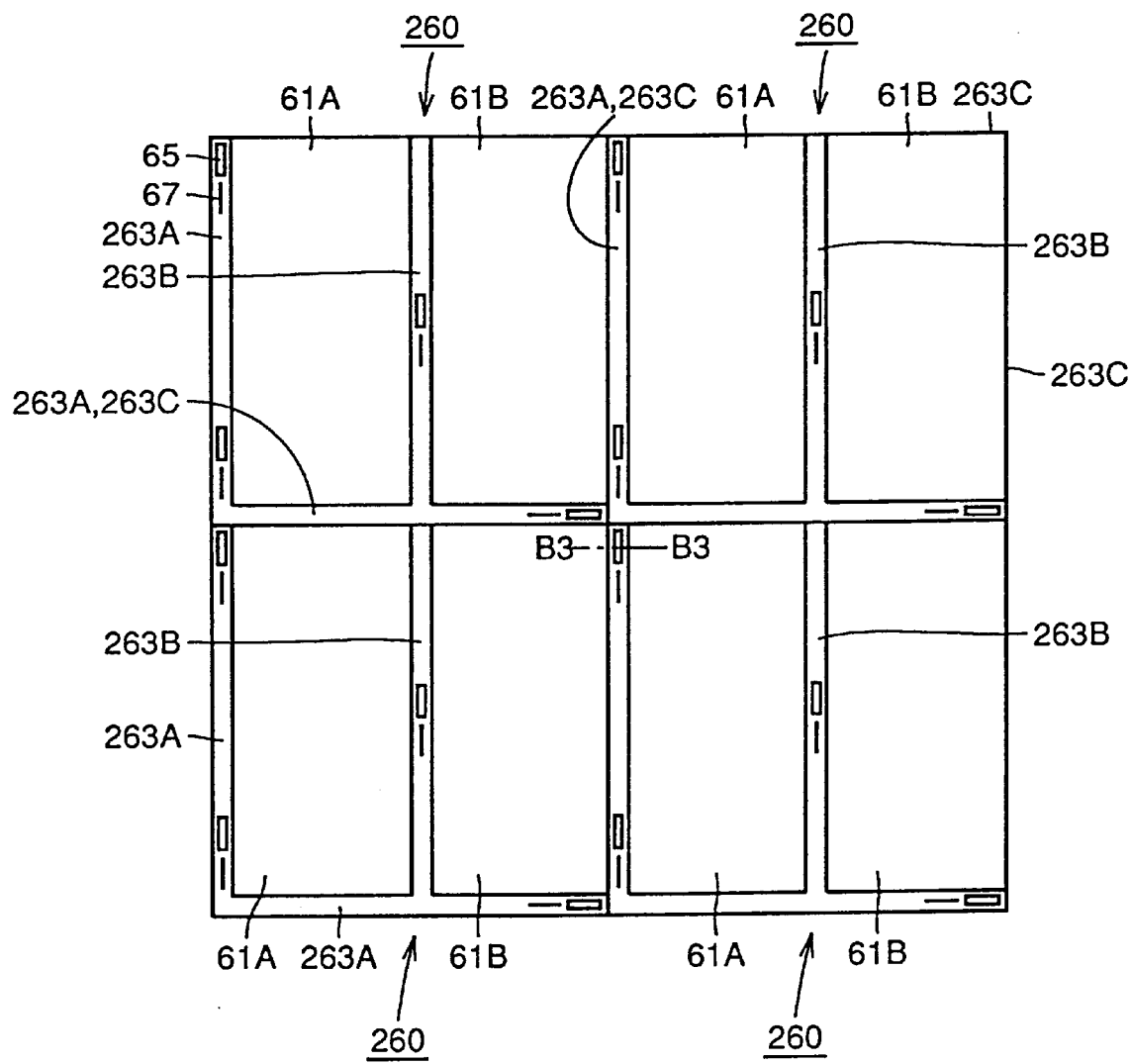
FIG. 19 shows exposure of the reticle shown in FIG. 15 on a photoresist of a wafer by step and repeat.

Exposure light beam which has passed through reticle 10 shown in FIG. 1 irradiates the photoresist applied on the wafer, and one shot of exposure is completed. Thereafter, stage 52 mounting the wafer moves as shown in FIG. 14 and the next shot is exposed. In this manner, a plurality of shots 60 are exposed on the photoresist as shown in FIG. 6.

Figure 6:
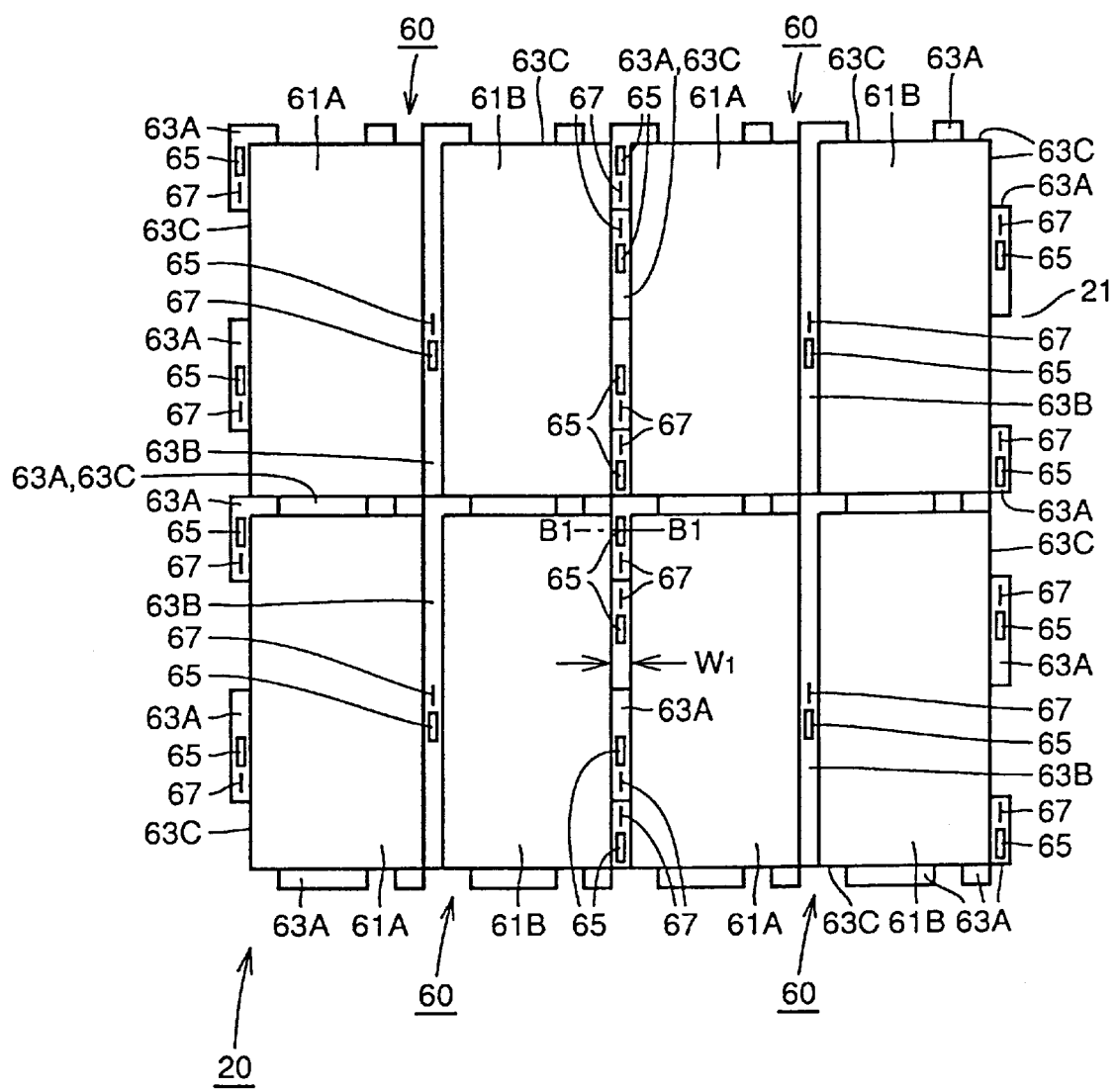
FIG. 6 is a plan view showing the reticle shown in FIG. 1 exposed on a photoresist of a wafer by step and repeat.

Referring to FIG. 6, at the time of exposure, between adjacent shots, exposure is performed such that a wide portion of a dicing region of one shot fits a narrow portion of a dicing region of the other shot, while a narrow portion of a dicing region of one shot fits a wide portion of a dicing region of the other shot. Patterns of alignment marks 65 and registration accuracy measurement marks 67 are exposed corresponding to respective corners, at the wide portions having wide width of dicing region 63A.

Further, exposure is performed such that an overlap region 4 (FIGS. 2, 3) of an already exposed shot is superposed on an overlap region 4 of a shot which is to be newly exposed. This is to prevent any region between adjacent shots from being left unexposed, because of step offset experienced at the time of step and repeat exposure.

The shot 60 includes element forming regions 61A and 61B, relatively wide dicing regions 63A and 63B, a relatively narrow dicing region 63C (not shown), an alignment mark region 65 and a registration accuracy measurement mark region 67, corresponding to reticle 10. FIG. 6 shows a state in which four shots are exposed.

Figure 4B:
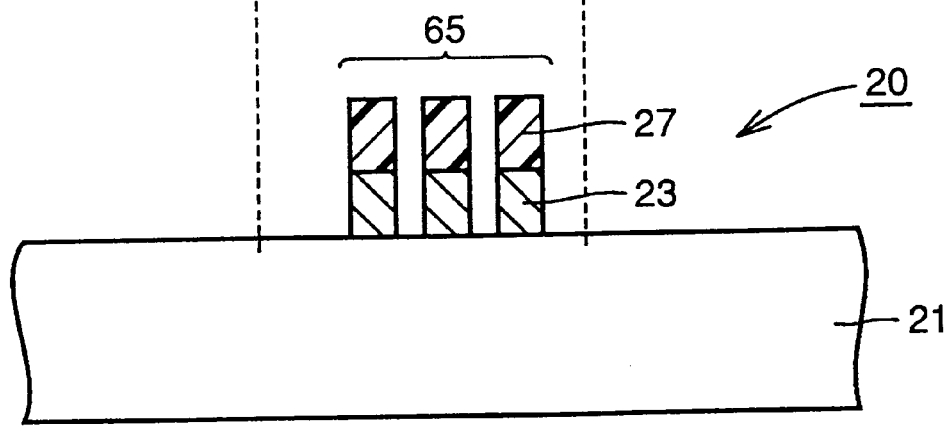
FIG. 4B is a schematic cross section of a wafer on which the reticle pattern of FIG. 4A is transferred.

After exposure of each shot 60, the photoresist is developed and a resist pattern is formed. FIG. 4B corresponds to a cross section taken along the line B1—B1 of FIG. 6 of the wafer corresponding to the reticle shown in FIG. 4A. Referring to FIG. 4B, when photoresist 27 is of positive type, only non-exposed regions of photoresist 27 are left by development. Using resist pattern 27 as a mask, underlying film 23 to be etched is etched, and thus film 23 is patterned to a prescribed shape. Thereafter, resist pattern 27 is removed. Here, formation of a protruding type alignment mark 23 on semiconductor substrate 21 in alignment mark region 65 is shown as an example.

In FIG. 4B, photoresist 27 is not left in the light intercepting region of the wafer, as element forming region 61B and part of the dicing region of the neighboring shot are positioned in this region.

Figure 7A:
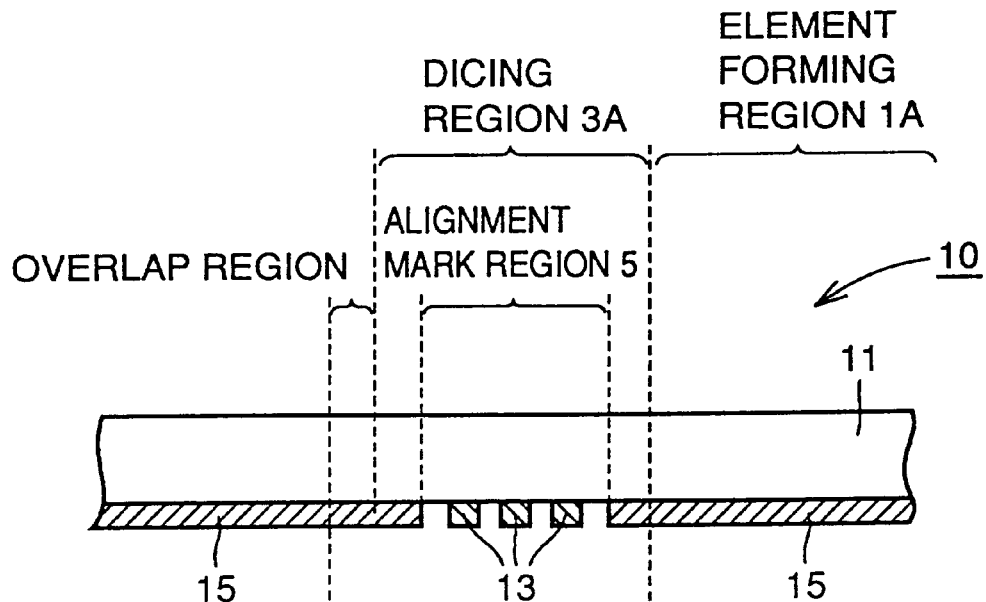
FIG. 7A is a partial cross section of the reticle shown in FIG. 1.
Figure 7B:
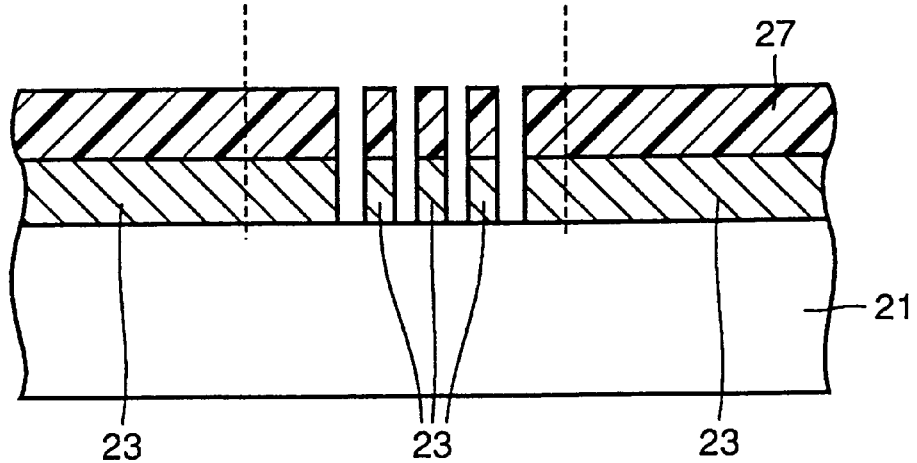
FIG. 7B is a schematic cross section of a wafer on which the pattern of the reticle of FIG. 7A is transferred.

When an alignment mark of recessed type is to be formed, reticle 10 having such a structure as shown in FIG. 7A in cross section taken along the line A1—A1 of FIG. 2 may be used. Referring to FIGS. 7A and 7B, when a positive photoresist 27 is used, light intercepting film 13 is removed from only that region where alignment mark is formed.

Using reticle 10 of FIG. 7A, photoresist 27 applied to the wafer of FIG. 7B is exposed and developed. At this time, since photoresist 27 is positive, only the exposed region of photoresist 27 is removed and resist pattern 27 is formed. Therefore, in resist pattern 27, the photoresist does not exist only on the alignment mark forming portion. Using resist pattern 27 as a mask, underlying film 23 is etched, and recessed type alignment mark is formed in the etched film 23. Thereafter, resist pattern 27 is removed.

Figure 20:
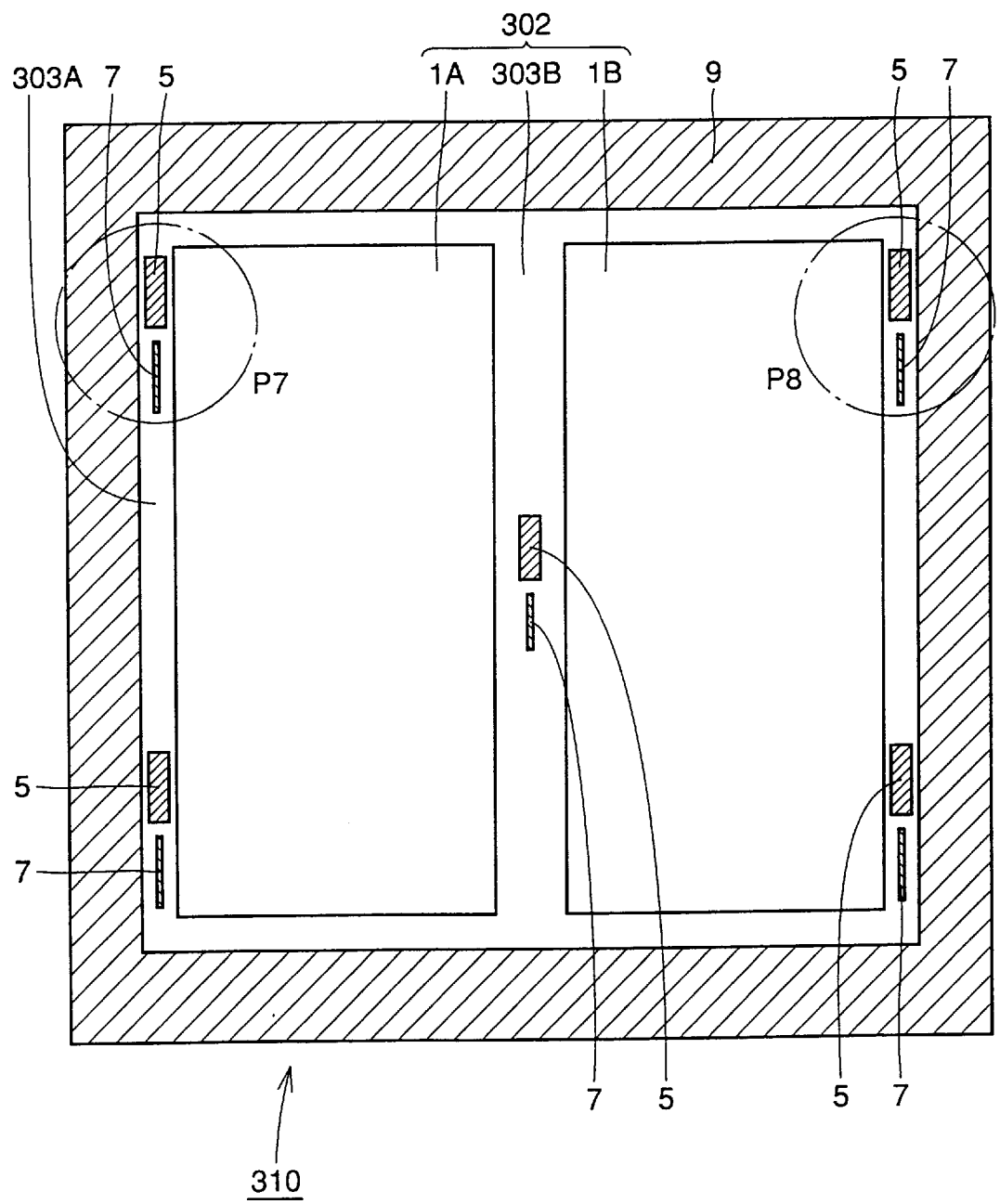
FIG. 20 is a schematic plan view showing a second example of a conventional reticle.

In the present embodiment, dicing regions 3A and 3C have such shapes that a wide portion 3A of one dicing region arranged at one of opposing sides of prescribed region 2 is fit in a narrow portion 3C of the other dicing region on the other side. Therefore, when shots are transferred side by side as shown in FIG. 6, the width $W_1$ of dicing regions 63A and 63C positioned between neighboring shots 60 can be made thinner than the width $W_0$ of the prior art example shown in FIG. 21. Therefore, yield of semiconductor chips taken out from one wafer can be increased as compared with the reticle of the prior art shown in FIG. 20.

Further, dicing regions 3A and 3C arranged at the outer periphery have widths $W_{11}$ and $W_{12}$ vary as shown in FIG. 1, and hence the dicing regions have extended portions 3A which is wide and recessed portions 3C which is narrower. Therefore, by arranging monitor mark regions 5 and 7 at extended portions 3A with larger width of dicing regions, it becomes possible to arrange monitor mark regions 5 and 7 corresponding to all four corners of the prescribed region 2. Therefore, position offset information of the corners of prescribed region 2 is never missed. Accordingly, degradation in registration accuracy caused by shot rotation error or shot magnification error can be prevented.

A light intercepting film 9 is formed at the outermost periphery of reticle 10 as shown in FIG. 1. This is to prevent double exposure with neighboring shot, when shots are transferred side by side as shown in FIG. 6.

Referring to FIGS. 2 and 3, dicing region 3A is provided with a so-called overlap region 4 of a prescribed width W4.

Overlap region 4 is for overlapping neighboring shots. By overlapping or superposing the overlap regions, even when there is a step offset at the time of step and repeat exposure, there is not any region left unexposed between the dicing regions of adjacent shots.

Dicing region 3A may have two or more extended portions 3A or recessed portions 3C. Dicing region 3A may be designed arbitrarily so long as the region allows arrangement of monitor mark regions 5 and 7 corresponding to all four corners of prescribed region 2 and that a wide portion 3A of one dicing region arranged on one of opposing sides of prescribed region 2 fits a narrow portion 3C of the other dicing region on the other side.

Figure 8:
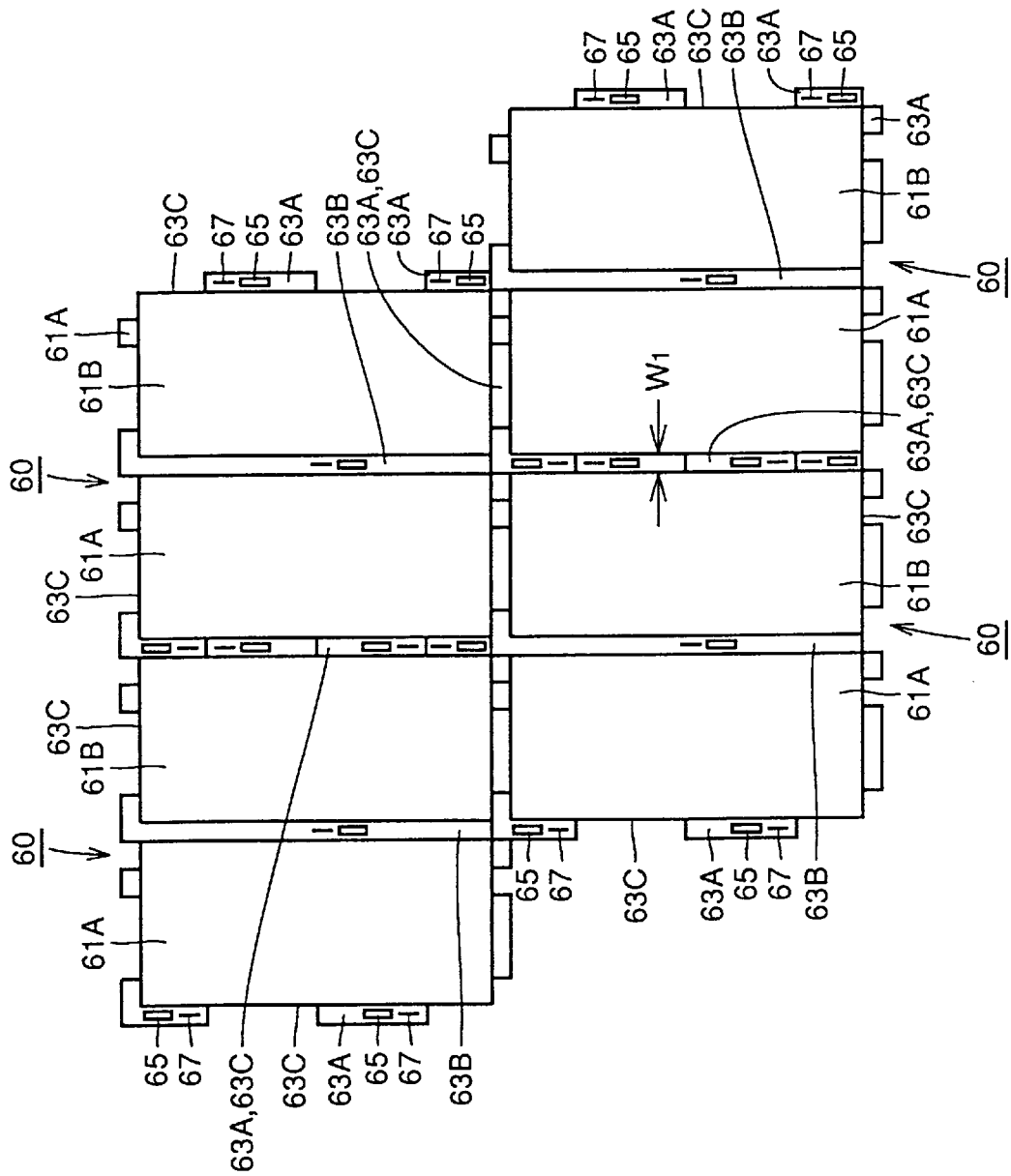
FIG. 8 is a plan view showing exposure of an upper shot and a lower shot offset by ½ shot.

Exposure may be performed with an upper shot and lower shot offset by ½ as shown in FIG. 8. The structure described above should preferably allow fitting of a wide portion 63A of one dicing region in a narrow portion 63C of the other dicing region, of the upper and lower shots.

Second Embodiment

Figure 9:
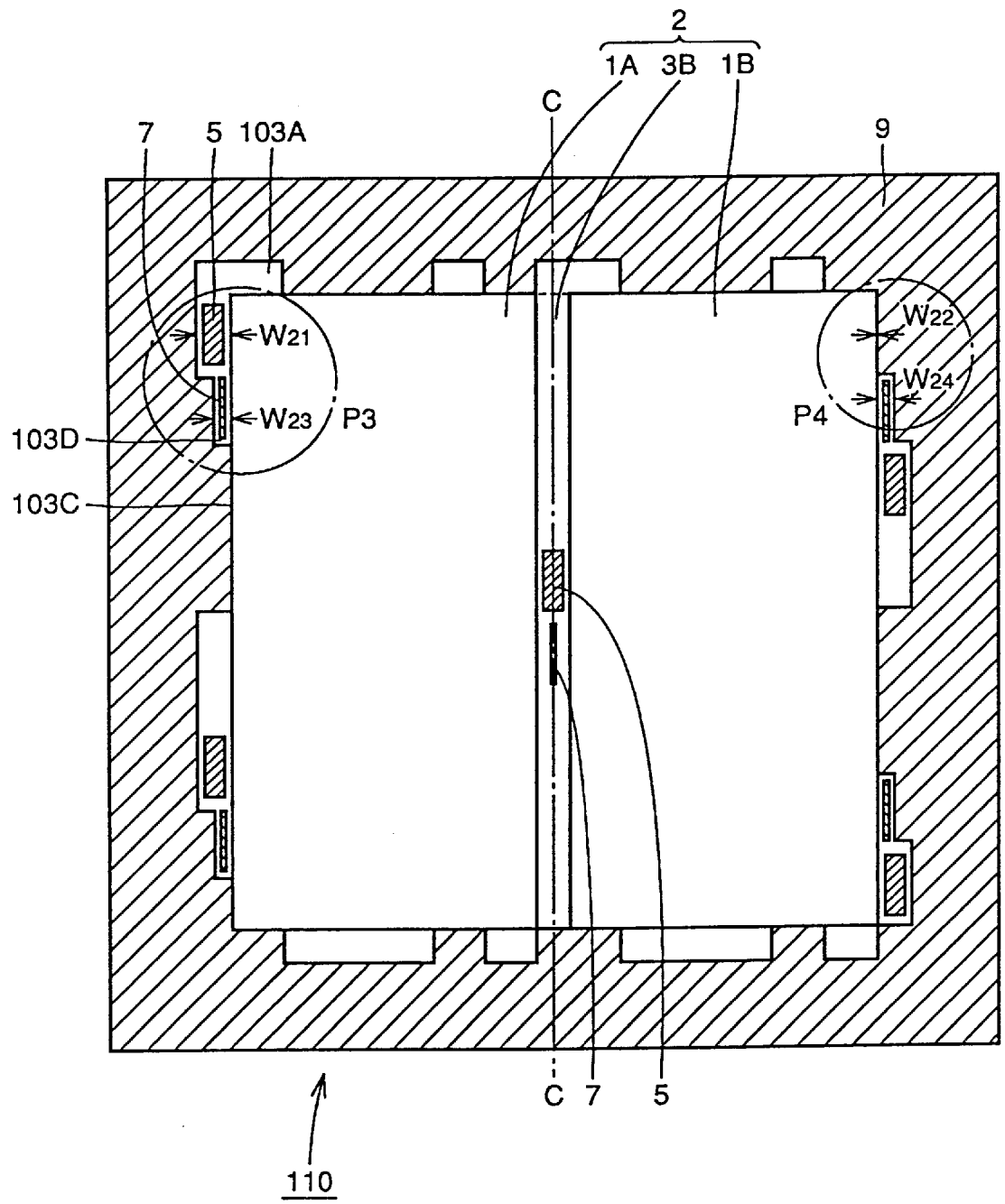
FIG. 9 is a plan view schematically showing a structure of the reticle in accordance with the second embodiment of the present invention.

Referring to FIG. 9, the present embodiment is the same as the first embodiment in that dicing regions 103A, 103C and 103D arranged at the outer periphery of prescribed region 2 have recessed and protruding shapes, and that monitor mark regions 5 and 7 are arranged corresponding to all four corners of prescribed region 2 at the protruding portions.

What is different is the widths $W_{23}$ and $W_{24}$ of dicing region 103D on which registration accuracy measurement mark region 7 is arranged. Widths $W_{23}$ and $W_{24}$ are made narrower than the width $W_{21}$ of the dicing region of portion 103A where alignment mark 5 is arranged, and wider than the width $W_{22}$ of a portion 103C where marks are not arranged. More specifically, in the present embodiment, dicing regions 103A, 103C and 103D have widths changed in three steps.

Other than these points, the embodiment is similar to the first embodiment described above. Therefore, corresponding portions are denoted by the same reference characters and description thereof is not repeated.

Figure 12:
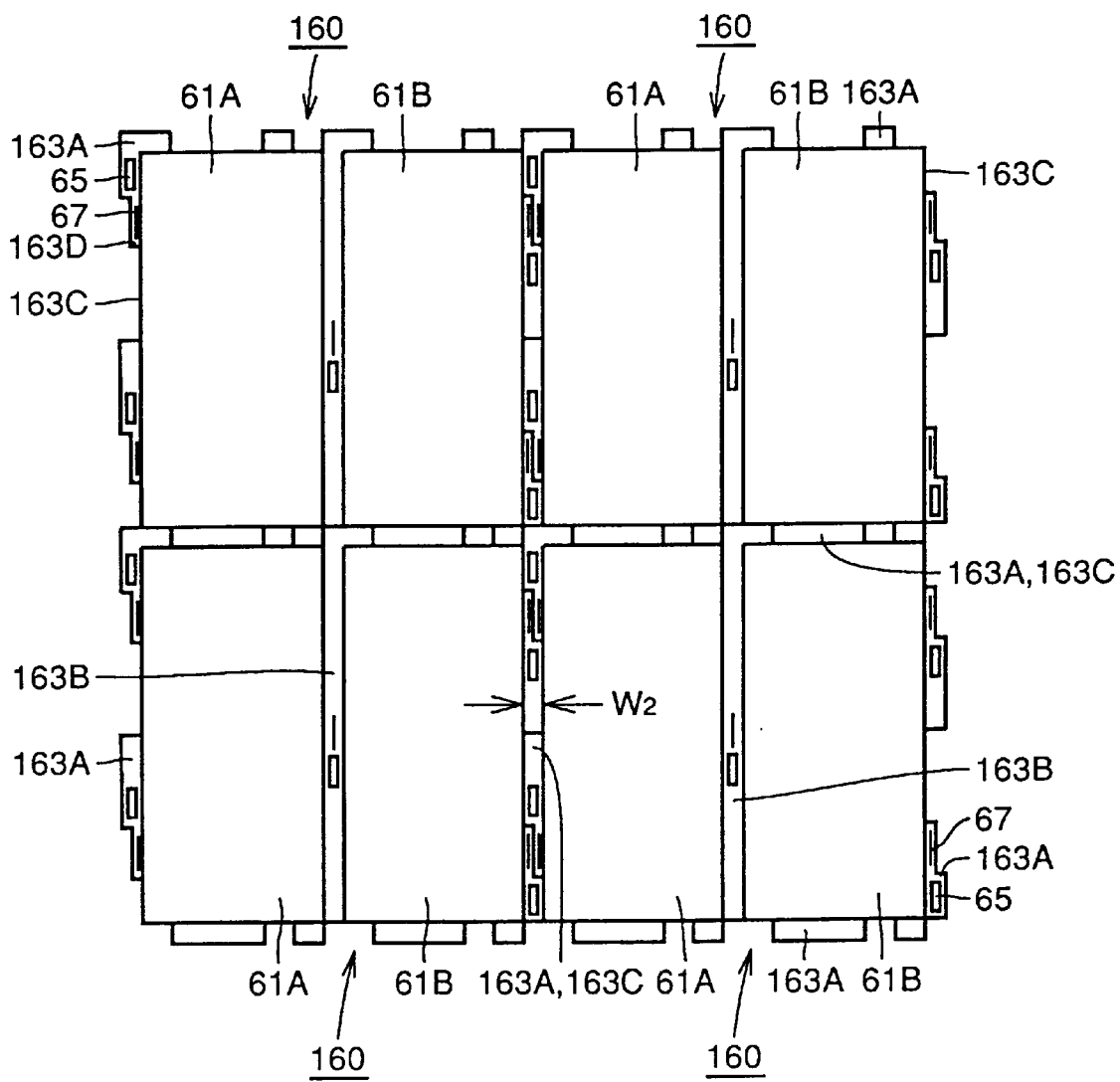
FIG. 12 is a plan view showing exposure of the reticle shown in FIG. 9 on a photoresist of a wafer by step and repeat.

Using the reticle shown in FIG. 9, a plurality of shots 160 are exposed by step and repeat as shown in FIG. 12, in the similar manner as in the first embodiment. Accordingly, element forming regions 61A and 61B, dicing regions 163A, 163B, 163C and 163D, an alignment mark region 65 and a registration accuracy measurement mark region 67 are exposed, corresponding to the reticle of FIG. 9.

Figure 10:
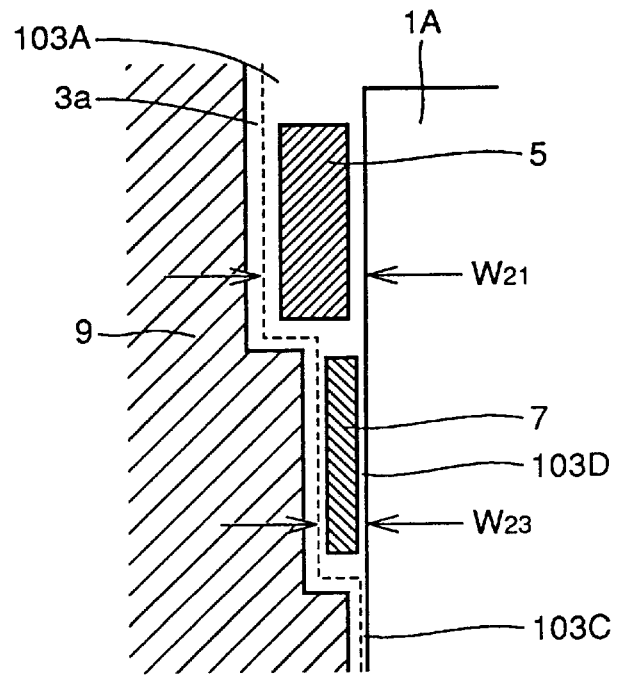
FIG. 10 is a partial plan view showing, in enlargement, a region P3 of FIG. 9.
Figure 11:
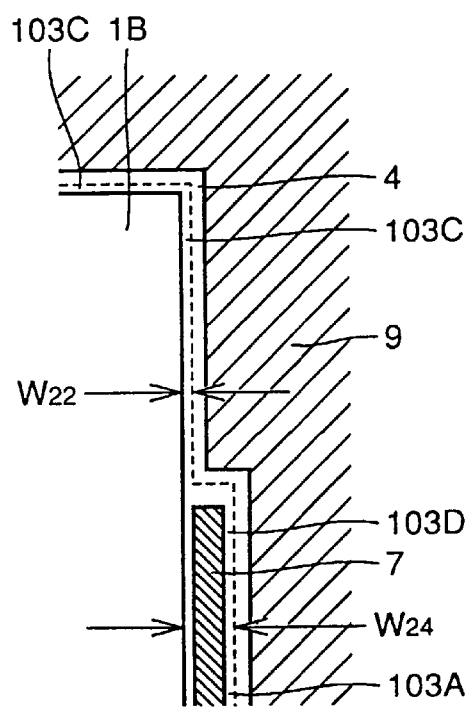
FIG. 11 is a partial plan view showing, in enlargement, a region P4 of FIG. 9.

At the outermost peripheral region of dicing regions 103A, 103C and 103D, an overlap region 4 may be provided as in the first embodiment, as shown in FIGS. 10 and 11. By this region, even when there is a step offset at the time of step and repeat exposure, there is not any region left unexposed between dicing regions of adjacent shots.

Since light intercepting film 9 is provided on the outer peripheral region of dicing region 103A, double exposure between neighboring shots can be prevented, as in the first embodiment.

Though dicing regions 103A, 103C and 103D have the widths changed in three steps in the present embodiment, the change may not be in three steps, and the width may be changed in four or more steps, or may be changed not stepwise but continuously.

Figure 13:
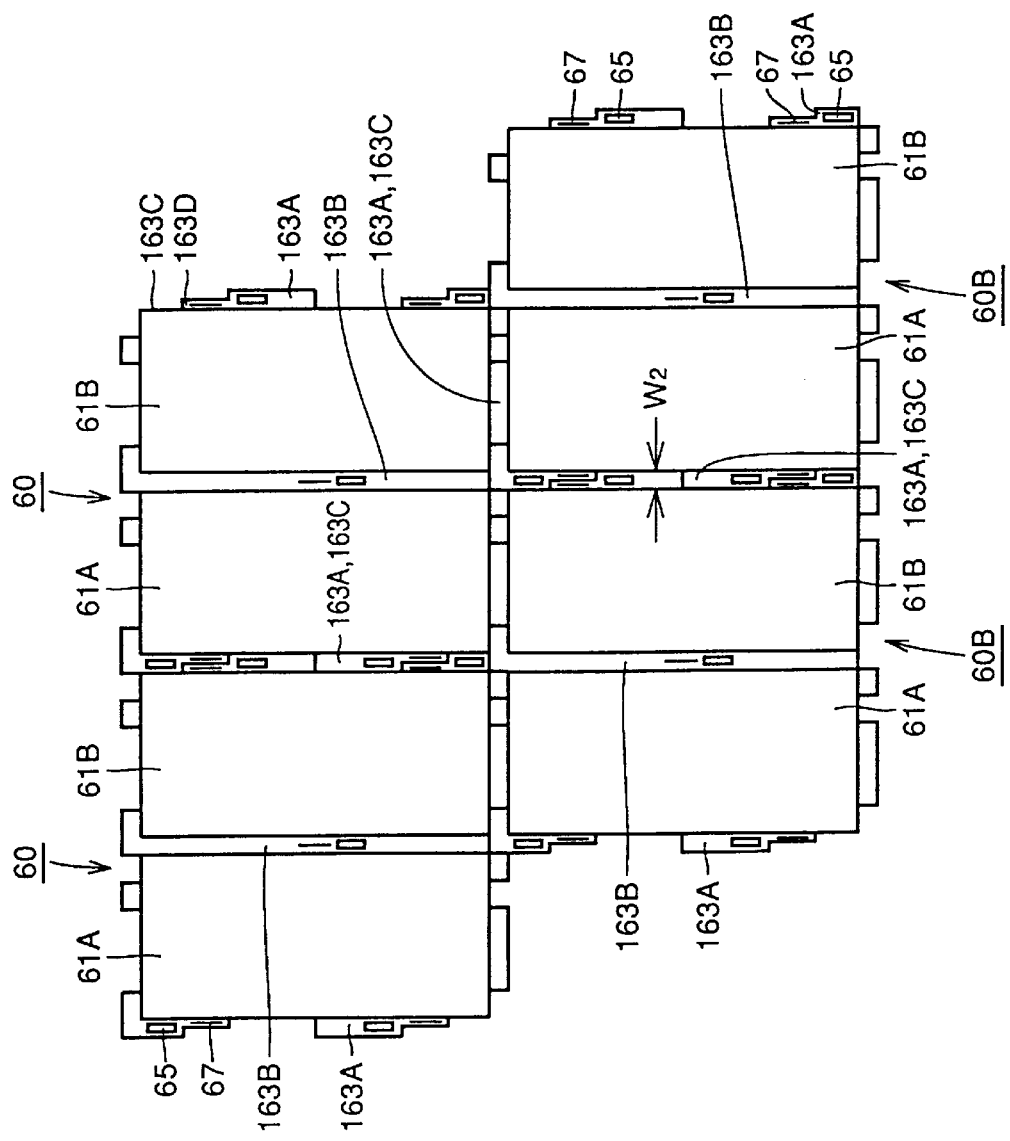
FIG. 13 is a schematic plan view showing exposure of an upper shot and a lower shot offset by ½ shot.

In the present embodiment also, it is preferred that dicing regions 103A are formed such that wide portions and narrow portions of dicing regions of one shot are fitted in the narrow portions and wide portions of dicing regions of another shot, even when the shots are transferred offset by ½ as shown in FIG. 13.

Figure 21:
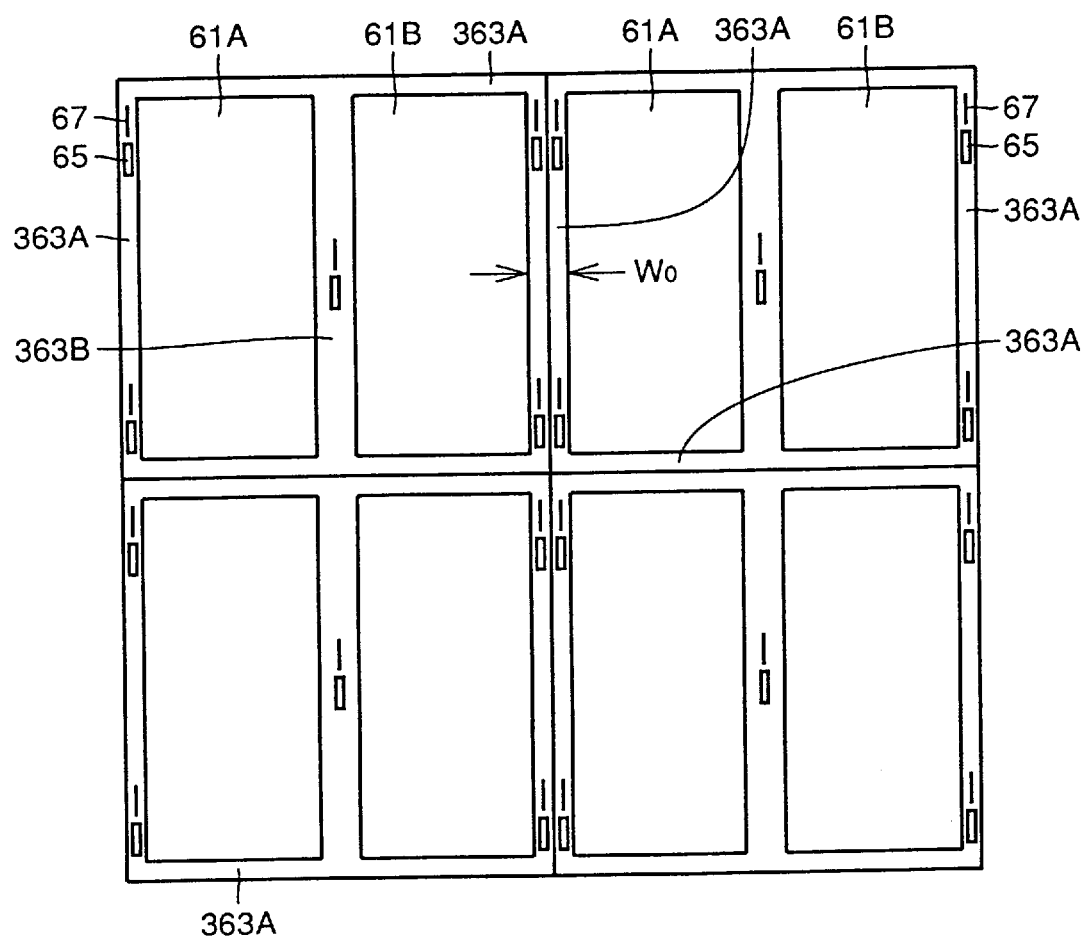
FIG. 21 is a plan view showing exposure of the reticle shown in FIG. 20 on a photoresist of the wafer by step and repeat.

In the present embodiment also, as the narrow portions and wide portions of the dicing regions of shots transferred to the photoresist are fitted as in the first embodiment, the width $W_2$ of the dicing regions can be made narrower than the width $W_0$ of the prior art example shown in FIG. 21. Therefore, yield of semiconductor chips which can be taken from a wafer can be improved.

Further, monitor mark regions 5 and 7 can be arranged corresponding to all four corners of prescribed region 2 at wide portions 103A and 103D as shown in FIG. 9. Therefore, position offset information is not missed at any corner, and therefore degradation in registration accuracy caused by shot rotation error or shot magnification error can be prevented.

Though two element forming regions are formed in the first and second embodiments, the prescribed region 2 may consist of a single element forming region, or it may include three or more element forming regions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reticle, comprising:

a prescribed region having rectangular planar shape, consisting of a single element forming region, or a plurality of said element forming regions and an intermediate dicing region placed between said element forming regions;

a first outer peripheral dicing region in contact with one side of opposing sides of the rectangular planar shape of said prescribed region, and having an extended portion of larger width and a recessed portion of narrower width;

a second outer peripheral dicing region arranged in contact with the other one side of said opposing sides, and having a planar shape with a recessed portion and an extended portion which fit said extended portion and said recessed portion of said first outer peripheral dicing region; and monitor mark regions arranged in said extended portions of said first and second outer peripheral dicing regions corresponding to all of four corners of the rectangular planer shape of said prescribed region.

2. The reticle according to claim 1, having a transparent substrate, and a light intercepting film formed on a surface of said transparent substrate, wherein said light intercepting film is formed on an outer periphery of said recessed portion of said first and second outer peripheral dicing regions arranged at an outer periphery of said prescribed region.

3. The reticle according to claim 1, wherein at least one of said first and second outer peripheral dicing regions has two or more said extended portions or said recessed portions.

4. The reticle according to claim 3, wherein two or more said extended portions have mutually different widths.

5. The reticle according to claim 1, wherein said first outer peripheral dicing region has a first portion having a first length extending from a first point on said one side toward one end of said one side and a second portion having a second length extending from said first point toward the other end of said one side;

said second outer peripheral dicing region has a first portion having the second length extending from a second point on said the other side toward said one end of said the other side and a second portion having the first length extending from said second point to said the other end of said the other side;

said extended portion and said recessed portion of said first portion of said first outer peripheral dicing region have such shapes that fit said recessed portion and said extended portion of said second portion of said second outer peripheral dicing region; and said extended portion and said recessed portion of said second portion of said first outer peripheral dicing region have such shapes that fit said recessed portion and said extended portion of said first portion of said second outer peripheral dicing region.

6. An exposure apparatus including a light source emitting exposure light beam, a reticle irradiated with the exposure light beam from said light source and a stage, for emitting the exposure light beam passed through said reticle to said stage, said reticle including
a prescribed region having a rectangular planar shape, consisting of a single element forming region or a plurality of said element forming regions and an intermediate dicing region placed between said element forming regions,
a first outer peripheral dicing region in contact with one side of opposing sides of the rectangular planar shape of said prescribed region, and having an extended portion of larger width and a recessed portion of narrower width,
a second outer peripheral dicing region arranged in contact with the other one side of said opposing sides, and having a planar shape with a recessed portion and an extended portion which are fit in said extended portion and said recessed portion of said first outer peripheral dicing region, and
monitor mark regions arranged in said extended portions of said first and second outer peripheral dicing regions corresponding to all of four corners of the rectangular planar shape of said prescribed region.

7. A method of exposure for transferring reticle patterns side by side continuously as shots on a wafer surface through a reduction type projecting lens by step and repeat, comprising the steps of:

emitting an exposure light beam from a light source;

irradiating said reticle with said exposure light beam; and projecting the exposure beam which has passed through said reticle to a photoresist on a semiconductor substrate;

said reticle including
a prescribed region having rectangular planar shape, consisting of a single element forming region or a plurality of said element forming regions and an intermediate dicing region placed between said element forming regions,
a first outer peripheral dicing region in contact with one side of opposing sides of the rectangular planar shape of said prescribed region and having an extended portion of larger width and a recessed portion of narrower width,
a second outer peripheral dicing region arranged in contact with the other one side of said opposing sides and having a planar shape with a recessed portion and an extended portion which fit in said extended portion and said recessed portion of said first outer peripheral dicing region, and
monitor mark regions arranged in said extended portions of said first and second outer peripheral dicing regions corresponding to all of four corners of the rectangular planar shape of said prescribed region; and
said step of projecting said exposure light beam to said photoresist including the step of exposing adjacent one and another shots such that said extended portion of said first outer peripheral dicing region of said one shot is fit in said recessed portion of said second outer peripheral dicing region of said another shot, and that said extended portion of said second outer peripheral dicing region of said another shot is fit in said recessed portion of said first outer peripheral dicing region of said one shot.

8. The method of exposure according to claim 7, wherein said reticle further includes an overlap region arranged entirely on an outer periphery of and in contact with said first and second outer peripheral dicing regions, and said one and another shots are exposed such that said overlap region in contact with said first outer peripheral dicing region of said one shot is overlapped with said overlap region in contact with said second outer peripheral dicing region of said another shot.

9. A semiconductor device have a pattern transferred by using the method in accordance with claim 7.

* * * * *